United States Patent
Lundberg

(10) Patent No.: US 6,741,115 B2
(45) Date of Patent: May 25, 2004

(54) DIGITAL LEVEL SHIFTER FOR MAINTAINING GATE OXIDE INTEGRITY OF SCALED DRIVER DEVICES

(75) Inventor: James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 0 days.

(21) Appl. No.: 10/317,241

(22) Filed: Dec. 11, 2002

(65) Prior Publication Data

US 2003/0231045 A1 Dec. 18, 2003

Related U.S. Application Data

(60) Provisional application No. 60/390,025, filed on Jun. 18, 2002.

(51) Int. Cl.[7] .................................. H03L 5/00
(52) U.S. Cl. .................. 327/333; 327/108; 327/112; 326/68; 326/81
(58) Field of Search ................ 327/333, 108, 327/112, 379, 389, 391; 326/68, 80, 81, 83

(56) References Cited

U.S. PATENT DOCUMENTS

| | | | | |
|---|---|---|---|---|
| 5,825,205 A | * | 10/1998 | Ohtsuka ...................... | 326/81 |
| 5,969,542 A | | 10/1999 | Maley et al. .................. | 326/81 |
| 5,995,010 A | | 11/1999 | Blake et al. ................... | 326/80 |
| 6,025,737 A | | 2/2000 | Patel et al. .................... | 326/80 |
| 6,040,708 A | | 3/2000 | Blake et al. .................. | 326/89 |
| 6,118,302 A | | 9/2000 | Turner et al. ................. | 326/81 |
| 6,268,744 B1 | | 7/2001 | Drapkin et al. ............... | 326/81 |
| 6,342,794 B1 | | 1/2002 | Turner et al. ................. | 326/68 |
| 6,344,758 B1 | | 2/2002 | Turner et al. ................. | 326/68 |
| 6,407,579 B1 | | 6/2002 | Goswick ...................... | 326/81 |
| 6,518,818 B1 | * | 2/2003 | Hynes ......................... | 327/333 |

FOREIGN PATENT DOCUMENTS

| | | |
|---|---|---|
| EP | 0703665 | 9/1995 |
| EP | 1081860 | 8/2000 |
| JP | 08148988 | 6/1996 |

* cited by examiner

Primary Examiner—Long Nguyen
(74) Attorney, Agent, or Firm—Gary R. Stanford; Richard K. Huffman; James W. Huffman

(57) ABSTRACT

A digital level shifter for driving the input of a scaled P-channel driver device within a voltage shifted range to preclude gate-oxide breakdown of the scaled driver device. The scaled driver device has an output operative within an elevated voltage range, so that the voltage shifted range biases the voltage associated with a logic signal from a lower voltage level to an intermediate level to preclude gate-oxide breakdown and protect the scaled driver device. The digital level shifter is implemented using digital devices thereby avoiding analog bias devices. The digital level shifter and the scaled driver device may be implemented on the same integrated circuit (IC) and fabricated using the same process as core circuitry so that the IC may directly interface external devices operating at elevated voltage levels without damaging the core circuitry or the scaled driver device.

20 Claims, 2 Drawing Sheets

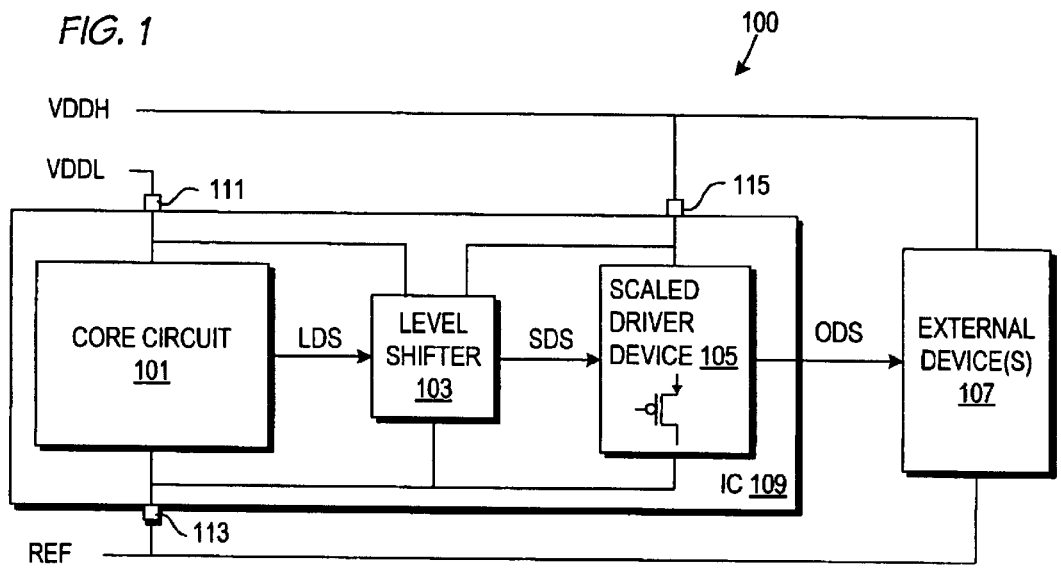
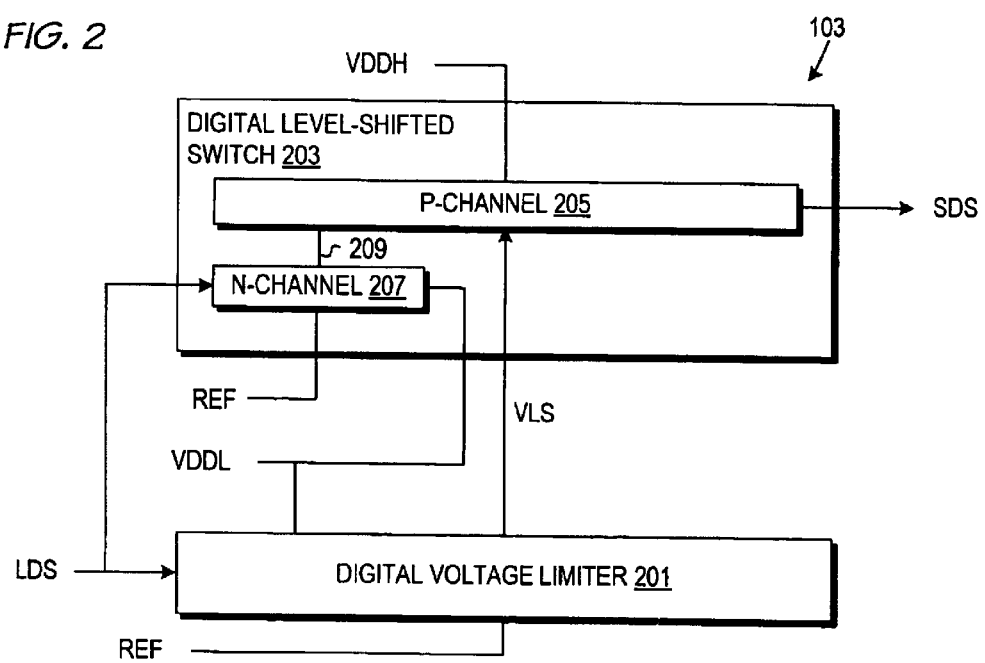

DIGITAL LEVEL SHIFTER FOR MAINTAINING GATE OXIDE INTEGRITY OF SCALED DRIVER DEVICES

CROSS-REFERENCE TO RELATED APPLICATIONS

This application claims the benefit of U.S. Provisional Application No. 60/390,025 filed on Jun. 18, 2002.

This applications is related to U.S. Non-Provisional patent application Ser. No. 10/317,241, entitled THIN GATE OXIDE OUTPUT DRIVER, having common inventors, common assignee, and filed on the same day as this application.

BACKGROUND OF THE INVENTION

1. Field of the Invention

This invention relates to voltage shifter circuits, and more particularly to a digital level shifter for maintaining gate oxide integrity of driver devices provided to interface external devices operating at elevated voltage levels, where the driver devices have been scaled to the extent that they cannot tolerate elevated-voltage inputs.

2. Description of the Related Art

As integrated circuit design and fabrication techniques have evolved over the years, the trend is that operating voltages have scaled downward along with device size. Very Large Scale Integrated (VLSI) circuits, particularly microprocessors, tend to lead in the area, of size and voltage scaling. As a result, VLSI devices which operate at lower voltages are required to interface to external devices, such as input/output (I/O) devices or the like, that have not been scaled to the same extent as the VLSI devices. Nonetheless, the external devices must be driven to voltage levels much higher than those of the VLSI device cores. As a result, many existing scaled VLSI devices provide voltage conversion circuits to increase the voltage swing of I/O signals so that they can properly interface to the elevated voltage external devices.

In more recent years, however, VLSI device sizes and operating voltages have decreased to the extent that, in some cases, scaled P-channel devices that provide an interface to elevated voltage external devices experience gate oxide breakdown if those same elevated voltage levels are used to drive their inputs. Because these P-channel devices have been significantly scaled, their gate oxide thickness is so thin that, if their gate is taken to the lowest voltage in the digital voltage range (e.g., 0 volts) while their source is tied to the elevated voltage (e.g., 3.3 volts), then the source-to-gate voltage $V_{SG}$, the channel-to-gate voltage $V_{CG}$, and the drain-to-gate voltage $V_{DG}$, all exceed the breakdown voltage of the gate oxide, referred to as $V_{BROX}$.

Voltage conversion circuits have heretofore been very simple because their only requirement has been to increase the level of a logic 1 (say, from 3.3 volts to 5 volts) while maintaining zero (0) volts as a logic zero level. However, conventional level shifting techniques are becoming clearly disadvantageous as silicon devices. continue to scale downward. For example, VLSI devices. today are fabricated using a 0.18 micron process that results in a gate oxide thickness of approximately 40 angstroms (Å) on a typical device. Skilled artisans will appreciate that the breakdown voltage for silicon dioxide (SiO2) is roughly $10^7$ volts per centimeter (V/cm), and they also appreciate that it is prudent to restrict gate voltages to approximately 60 percent of the breakdown value. Hence, a prudent breakdown threshold, $V_{BROX}$, for a 0.18 micron device is approximately 2.4 volts. The 0.18 micron devices are typically operated at VDD=1.8 volts referenced to ground at 0 volts, so that they generate a logic one (1) at 1.8 volts and a logic 0 at 0 volts. Thus, gate oxide breakdown at core voltage levels is not a problem. These devices, however, are typically required to interface to external Complementary Metal-Oxide Semiconductor (CMOS) devices that operate at higher voltage levels, such as 3.3 volts. As a result, pulling a 0.18 micron P-channel output device up to 3.3 volts, while holding its gate at zero volts will very likely damage the gate oxide of the P-channel device. Consequently, a traditional voltage conversion circuit will not work under these circumstances.

More recent techniques for output voltage scaling utilize both digital and analog circuits to shift a logic 1 at a core voltage level up to the elevated level of the external devices, and to shift a logic 0 from 0 volts up to an intermediate voltage level. The intermediate voltage level is chosen low enough to turn on a P-channel device, yet high enough to avoid breakdown of the gate oxide. The analog circuitry is employed to create a logic 0 bias for the digital circuits so that a logic 0 is established at the intermediate voltage level as opposed to 0 volts. Analog devices, however, tend to be physically large and power hungry, and these attributes make analog devices ill-suited for VLSI device applications.

Therefore, what is needed is to provide for control of scaled P-channel output driver devices which are subject to gate oxide breakdown because they have been scaled to the extent that their gate oxide layers are too thin to tolerate input signal levels at the same elevated levels which they are required to provide at their outputs.

SUMMARY OF THE INVENTION

A digital level shifter according to an embodiment of the present invention is provided to drive the input of a scaled driver device within a voltage shifted range to preclude gate-oxide breakdown of the scaled driver device. The scaled driver device has an output operative within an elevated voltage range, so that the voltage shifted range biases the voltage associated with a logic signal from a lower voltage level to an intermediate level to maintain the breakdown threshold and protect the scaled driver device. The digital level shifter is implemented using digital devices thereby avoiding analog bias devices. The digital level shifter and the scaled driver device may be implemented on the same integrated circuit (IC) and fabricated using the same process as core circuitry so that the IC may directly interface external devices operating at elevated voltage levels without damaging the core circuitry or the scaled driver device.

A digital level shifter according to an embodiment of the present invention includes a digital voltage limiter and a digital level-shifted switch. The digital voltage limiter is coupled to first and second source voltages having first and second voltage levels, respectively, defining a first voltage range. The digital voltage limiter receives a digital input signal operative within the first voltage range and provides a corresponding voltage limited signal operative within a limited voltage range between the second voltage level and an intermediate voltage level that has a magnitude between the first and second voltage levels. The intermediate voltage level is selected to prevent excessive input voltage to the scaled driver device. The digital level-shifted switch is coupled to a third source voltage and the first source voltage, where the third source voltage has a third voltage level magnitude that is greater than the second voltage level. The digital level-shifted switch receives the voltage limited signal and correspondingly switches a voltage shifted digital signal within a voltage shifted range defined between the intermediate and third voltage levels in response to switching of the voltage limited signal.

A digital level shifter according to another embodiment of the present invention includes a digital voltage divider and a digital level-shifted switch. The digital voltage divider includes P-channel devices coupled between a reference voltage and a first source voltage. The digital voltage divider receives a digital input signal operative within a first voltage range between the reference and first source voltages and has a junction that develops a voltage limited signal. The voltage limited signal is operative within a limited voltage range between the first source voltage and an intermediate voltage and has a voltage level between the reference voltage and the first source voltage. The digital level-shifted switch includes P-channel and N-channel devices coupled in a complementary configuration between the reference voltage and a second source voltage. The second source voltage has a voltage level that is greater than the first source voltage. The digital switch has an input that receives the voltage limited signal and an output that provides a shifted digital signal operative within a voltage shifted range between the intermediate and second source voltages.

An integrated circuit (IC) according to an embodiment of the present invention includes core circuitry, a digital level shifter and a scaled driver device. The core circuitry is coupled to a reference voltage and a first source voltage and generates a first digital signal operative within a lower voltage range defined by the reference and first source voltages. The digital level shifter is coupled to the reference and first source voltages and to a second source voltage. The second source voltage is greater than the first source voltage. The digital level shifter receives the first digital signal and provides a shifted digital signal indicative of the first digital signal. The shifted digital signal is operable between the second source voltage and an intermediate voltage, where the intermediate voltage is between the reference and first source voltages. The scaled driver device receives the shifted digital signal and provides a second digital signal indicative of the first digital signal. The second digital signal is operable in an elevated voltage range defined by the reference and second source voltages. Operation of the shifted digital signal at the intermediate voltage precludes oxide breakdown of the scaled driver device.

Other features and advantages of the present invention will become apparent upon study of the remaining portions of the specification and drawings.

BRIEF DESCRIPTION OF THE DRAWINGS

These and other objects, features, and advantages of the present invention will become better understood with regard to the following description, and accompanying drawings where:

FIG. 1 is a simplified block diagram of a system including a digital level shifter circuit implemented according to an embodiment of the present invention;

FIG. 2 is a simplified block diagram of an exemplary embodiment of the level shifter circuit of FIG. 1 according to the present invention.

DETAILED DESCRIPTION

Figure 3:
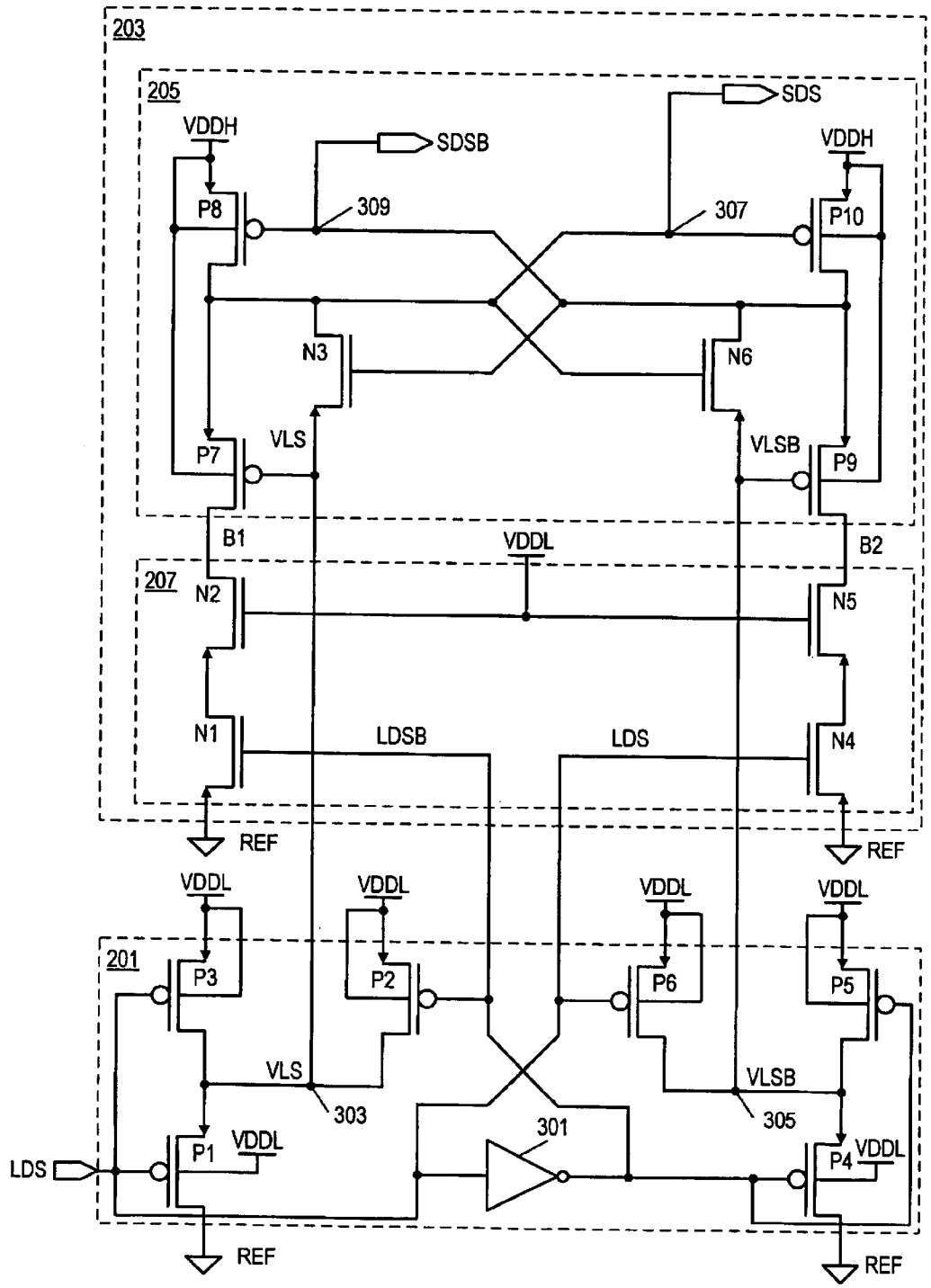
FIG. 3 is a more detailed schematic diagram of another exemplary embodiment of the level shifter circuit of FIG. 1.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for using scaled driver devices that are required to output elevated voltages but that cannot tolerate elevated input voltages. He has therefore developed a fully digital level shifter circuit for driving scaled driver devices at voltage levels that protect these scaled driver devices from gate oxide breakdown as will be further described below with respect to FIGS. 1–3.

FIG. 1 is a simplified block diagram of a system 100 including a digital level shifter circuit 103 implemented according to an embodiment of the present invention. The term "digital" as used herein refers to devices that operate in a similar manner as a switch having multiple discrete operating points associated with different logic states and/or different voltage levels. A core circuit 101 receives power via a first source voltage signal VDDL, having a voltage level or magnitude referenced with respect to a common or reference voltage source signal REF, which is also provided to the core circuit 101. A power or voltage source (not shown) generates a source voltage between VDDL and REF. VDDL and REF collectively define a first or lower voltage range suitable for providing power to devices within the core circuit 101. The core circuit 101 generates at least one logical or digital signal LDS, which is provided to an input of the level shifter circuit 103. The LDS signal has a first logic state at or near the voltage level of REF and a second logic state at or near the voltage level of VDDL. The logic states are typically referred to as logic one or "1" and logic zero or "0". Positive or negative logic is contemplated, so that either of the logic 1 and 0 states may be correspond to either REF or VDDL. The level shifter circuit 103 is coupled to VDDL and REF for providing power to internal digital circuitry, further described below, to enable detection of the logic state of the LDS signal.

The level shifter circuit 103 asserts a shifted logical or digital signal SDS to the input of a scaled driver device 105. The scaled driver device 105 is coupled between a second source voltage signal VDDH and REF, which collectively define a second or elevated voltage range. Another power or voltage source (not shown) generates a source voltage between VDDH and REF. The magnitude of VDDH is greater than the magnitude of VDDL, so that the second voltage range associated with VDDH is larger than the first voltage range associated with VDDL. The source voltages VDDL and VDDH are typically both positive, although the present invention contemplates the use of negative source voltages. The scaled driver device 105 generates an output logical or digital signal ODS to at least one "external" device 107, which is also coupled to VDDH and REF. The ODS signal is operative in the second voltage range having first and second logic states 0 and 1 with respective voltage levels within the voltage levels of VDDH and REF. Either of the logic 1 and 0 states may correspond to either REF or and VDDH, since positive or negative logic is contemplated. The external device 107 is "external" relative to the core circuit 101 and may be any type of input/output (I/O) device intended to interface the core circuit 101.

In operation, it is desired that the logic information of the LDS signal asserted by the core circuit 101 be conveyed to the external device 107. The external device 107, however, is designed to operate with logic signals having voltage levels defined within the second, elevated voltage range VDDH-REF, which is greater than the first, lower voltage range VDDL-REF. In this manner, the external device 107 must be driven to voltage levels higher than the LDS signal to facilitate logic switching. The LDS signal is converted to the SDS signal by the level shifter circuit 103, where the SDS signal operates within a voltage shifted range based on the voltage level, of VDDH and suitable to drive the input of the scaled driver device 105. The voltage shifted range does not extend within the full voltage range of the elevated voltage range, so that signal SDS is a voltage shifted digital signal. VDDH is provided to the level shifter circuit 103 to enable the level shifter circuit 103 to operate within the voltage shifted range. The scaled driver device 105 switches the ODS signal in the full elevated range needed to drive the input of the external device 107 in response to switching of the SDS signal. Thus, the level shifter circuit 103 and the scaled driver device 105 collectively convert the LDS signal operating within the lower voltage range suitable for the core circuit 101 to the ODS signal operating within the full voltage range suitable for the external device 107. In this manner, the core circuit 101 successfully conveys logical information to the external device 107 as desired.

The scaled driver device 105 incorporates one or more scaled P-channel devices (not shown) that provide the necessary interface to the elevated voltage levels of the external device 107. The scaled P-channel devices may experience gate oxide breakdown, however, if the full range of the elevated voltage levels is used to drive their inputs. In particular, the scaled driver device 105 may assert the ODS at approximately the voltage level of VDDH, but the SDS signal should not be pulled to the voltage level of REF at the same time since the voltage differential, VDDH-REF, across the scaled driver device 105 may cause gate oxide breakdown of the internal P-channel devices. The level shifter circuit 103 operates to switch the SDS signal within the voltage shifted range between an intermediate voltage level (INT) and the voltage level of VDDH. The INT voltage level has a magnitude greater than the magnitude of REF and is selected so that the voltage shifted range VDDH-INT does not exceed the breakdown voltage of the scaled P-channel devices within the scaled driver device 105. More specifically, the ODS signal may be driven to the voltage level of VDDH while SDS is driven to the INT voltage level without the risk of causing gate oxide breakdown of the P-channel devices of the scaled driver device 105.

As described previously, integrated circuit (IC) design and fabrication techniques have evolved such that operating voltages have scaled downward along with device size. VLSI circuits, particularly microprocessors, tend to lead in the area of size and voltage scaling. As a result, VLSI devices operating at lower voltages are often required to interface to external devices that have not been scaled to the same extent as the VLSI devices. The core circuit 101, for example, may be a VLSI device integrated into an IC 109, where it is desired that the IC 109 directly interface the external device 107. In one embodiment, the level shifter circuit 103 and the scaled driver device 105 are integrated into the same IC 109 as the core circuit 101. Further, the core circuit 101, the level shifter circuit 103, and the scaled driver device 105 are implemented using the same circuit scaling techniques, in which their constituent N-channel and P-channel devices have a relatively thin gate oxide thickness. In this manner, the IC 109 includes several external source pins or terminals for coupling to respective source voltages. As shown, for example, the IC 109 includes a first source terminal 111 for coupling to VDDL, a second source terminal 113 for coupling to REF, and a third source terminal 115 for coupling to VDDH. Within the IC 109, VDDL is coupled to the core circuit 101 and the level shifter circuit 103, VDDH is coupled to the level shifter circuit 103 and the scaled driver device 105, and REF is coupled to the core circuit 101, the level shifter circuit 103, and the scaled driver device 105.

It is noted that the present invention is not limited to embodiments in which the level shifter circuit 103 and scaled driver device 105 are implemented with the same process and/or on the same IC as the core circuit 101. Each circuit may be implemented separately without departing from the spirit and scope of the present invention. The ability to design and manufacture these circuits on the same IC using similar fabrication techniques provides significant advantages, however, as appreciated by those skilled in the art. Also, it is possible to provide output voltage scaling using both digital and analog circuits to shift the higher voltage logic state to the elevated voltage level of the external device 107 while also shifting the lower voltage logic state to a higher voltage level (e.g., INT). In this case, the analog circuitry would be employed to create a logic voltage bias for the digital circuits. Analog devices, however, are large and require a great deal of power, and thus are ill-suited for VLSI device applications. It would generally defeat the purpose of VLSI to implement the analog devices directly on the IC 109 and analog devices implemented externally would consume valuable circuit board real estate and power.

In a more specific embodiment, the IC 109 is a VLSI device fabricated using a 0.18 micron process including metal-oxide semiconductor (MOS) devices which have a gate oxide thickness of approximately 40 Å. The core circuit 101 may be, for example, a microprocessor in which it is desired to maximize size and voltage scaling. As noted above, the gate oxide breakdown threshold $V_{BROX}$, for these devices is approximately 2.4 volts. VDDL is typically 1.8 volts relative to REF, which is typically zero volts or ground. Since the maximum voltage levels applied to the core circuit 101 are well below the threshold breakdown limit, oxide breakdown is not a concern. In the specific embodiment, the external device 107 includes 3.3-volt CMOS devices, so that VDDH is approximately 3.3 volts while REF is 0 volts. Also, the scaled driver device 105 includes 0.18 micron P-channel devices that are required to interface the 3.3-volt external device 107. The level shifter circuit 103 operates the SDS signal between approximately 1.0 volt and approximately 3.3 volts, where INT is approximately 1.0 volt. In this embodiment, the voltage shifted range is approximately 2.3 volts. In this case, the gates of the P-channel devices of the scaled driver device 105 integrated on the IC 109 do not drop below approximately 1.0 volt, so that the maximum voltage range is 2.3 volts. Since 2.3 volts is less than $V_{BROX}$ of approximately 2.4 volts, there is little risk of breaking down the gate oxide of the scaled P-channel devices.

It is noted that although 0.18 micron parts and associated voltage levels are referenced herein to illustrate the invented solution to problems associated with CMOS device scaling, the same solution equally applies to both larger and smaller devices. This is because the phenomena of gate oxide breakdown is not only a function of a device's fabrication process, but is also a function of the device's application, i.e., the voltage requirements of parts to which a fabricated device is required to interface. Accordingly, the present invention is not limited to 0.18 micron parts and associated voltage levels but instead is applicable to any technology in which scaling has been applied. Also, the source voltage signals may have different voltage levels and polarities defining any practicable voltage range for a given fabrication process. REF, for example, may be shifted to a voltage level other than zero, where the remaining source voltages are shifted accordingly to define desired or otherwise appropriate voltage ranges. The breakdown threshold is determined according to the fabrication process, application, and relative voltage levels to maintain gate oxide integrity of scaled driver devices.

In the embodiment illustrated, the level shifter circuit 103 is implemented on the IC 109 and includes digital logic to provide a shifted logic voltage range suitable for driving the input of the scaled driver device 105. In one embodiment, the level shifter circuit 103 includes 0.18 micron devices having a gate oxide thickness of 40 Å operating at a core source voltage level of 1.8 volts. The level shifter circuit 103 is used to drive the scaled driver device 105, which include 0.18 micron P-channel devices which operate up to 3.3 volts. The P-channel devices generate 3.3 volt logic levels required to interface the external device 107, so that the level shifter circuit 103 maintains the magnitude of the voltage range applied to the P-channel devices below 2.4 volts to preclude gate oxide breakdown. In one embodiment, for example, the level shifter circuit 103 limits the SDS signal from dropping below approximately 1.0 volt so that the maximum voltage applied across the scaled driver device 105 is 2.3 volts.

FIG. 2 is a simplified block diagram of an exemplary embodiment of the level shifter circuit 103 according to the present invention. In this case, the level shifter circuit 103 has two main stages, including a digital voltage limiter 201 and a digital level-shifted switch 203. The digital voltage limiter 201 is coupled to VDDL and REF and receives the LDS signal. The digital voltage limiter 201 detects switching of the LDS signal between high and low logic states within the voltage range VDDL-REF, and switches a corresponding voltage limited signal VLS to the digital level-shifted switch 203 in response to switching of the LDS signal to convey the logic information of the LDS signal. The digital voltage limiter 201 operates to keep the VLS signal within a limited voltage range between the voltage levels of VDDL and INT, where INT has a higher magnitude than REF. In particular, the VLS signal is asserted at approximately the voltage level of VDDL for one logic state (e.g., logic one) and at approximately the voltage level of INT for the other, opposite logic state (e.g., logic zero), or vice-versa.

The digital level-shifted switch 203 includes a P-channel circuit 205, referenced to VDDH, that receives the VLS signal and that asserts the SDS signal. The P-channel circuit 205 switches the SDS signal in response to switching of the VLS signal to convey the logical information of the LDS signal to the scaled driver circuit 105. The P-channel circuit 205 operates to keep the SDS signal within the voltage shifted range between VDDH and the intermediate voltage level INT. In particular, the SDS signal is asserted at approximately the voltage level of VDDH for one logic state (e.g., logic one) and at approximately the INT voltage level for the other, opposite logic state (e.g., logic zero) or vice-versa. As described previously, the voltage level of INT is selected relative to the voltage level of VDDH to prevent gate oxide breakdown of the P-channel devices of the scaled driver device 105. Thus, the SDS signal conveys the logic information of the LDS signal from the core circuit 101 while maintaining gate integrity of the scale driver device 105.

In the embodiment shown, the digital level-shifted switch 203 is configured in a complementary manner and includes an N-channel circuit 207 coupled to the P-channel circuit 205 via at least one bias node 209. The N-channel circuit 207 is coupled and referenced to VDDL and REF, yet maintains the voltage at the node 209 at a high enough level to avoid breakdown of devices within the P-channel circuit 205. The N-channel circuit 207 receives the LDS signal and switches in response to switching of the LDS signal to facilitate switching of the P-channel circuit 205. In general, the N-channel and P-channel circuits 205, 207 cooperate in a complementary switching fashion to enable the SDS signal to obtain the full voltage shifted range between VDDH and INT.

FIG. 3 is a more detailed schematic diagram of another exemplary embodiment of the level shifter circuit 103. Additional details are illustrated for particular embodiments of the digital voltage limiter 201 and digital level-shifted switch 203 including the P-channel and N-channel circuits 205 and 207. The digital voltage limiter 201 includes P-channel transistors P1–P6 and an inverter 301. The inverter 301 is employed to generate signal LDSB, which is an inverted version of the LDS signal. It is noted that a "B" appended to a signal name herein denotes logical negation in which the inverted, or complementary, signal has the opposite logic state. The N wells of the P-channel transistors P1–P6 are coupled to VDDL. The LDS signal is provided to the gates of P-channel transistors P1, P3 and P6 and to the input of the inverter 301. The LDSB signal is provided to the gates of the P-channel transistors P2, P4 and P5. The sources of P2, P3, P5, and P6 are coupled VDDL. The source of P1 is coupled to the drains of P2 and P3 at a junction 303, where the junction 303 develops the voltage limited signal VLS. The drain of P1 is coupled to REF, which is ground or zero volts in the embodiment shown. In a similar manner, the source of P4 is coupled to the drains of P5 and P6 at another junction 305 that develops an inverted voltage limited signal VLSB. The drain of P4 is coupled to REF. It is noted that the VLSB signal is not an inverted version of the VLS signal per se, but generally assumes the logic opposite state due to circuit symmetry and operation of the inverter 301 in response to switching of the LDS signal.

"The digital level-shifted switch 203 includes P-channel transistors P7, P8, P9, and P10 and N-channel transistors N1, N2, N3, N4, N5 and N6 (N1–N6). In the configuration shown, the P-Channel circuit 205 includes the transistors P7–P10 and the N-channel circuit 207 includes the transistors N1, N2, N4 and N5. VDDH is provided to the sources of P8 and P10. The drain of P8 is coupled to the gate of P10, to the source of P7, to the drain of N3 and to the gate of N6. The output signal SDS is developed at a first output node 307 coupled to the drain of P8. The gate of P7 and the source of N3 are coupled to the junction 303 to receive the VLS signal. In a similar manner, the drain of P10 is coupled to a complementary output node 309, which is coupled to the gate of P8, to the source of P9, to the drain of N6 and to the gate of N3. An inverted output signal SDSB is developed at the output node 309. The gate of P9 and the source of N6 are coupled to the junction 305 to receive the VLSB signal. The N wells of the P-channel transistors P7–P10 are all coupled to VDDH. Although the scaled driver device 105 was previously shown coupled to the SDS signal, it is understood that either or both of the SDS and SDSB signals may be employed to drive the inputs of scaled driver devices and that both of these output signals switch between the voltage shifted range VDDH-INT as further described below."

The drain of P7 is coupled to the drain of N2 at a node B1. The drain of P9 is coupled to the drain of N5 at a node B2. The nodes B1 and B2 collectively represent the bias node 209 of FIG. 2. The gates of N2 and N5 are coupled to VDDL. The source of N2 is coupled to the drain of N1, which has its source coupled to REF. The source of N5 is coupled to the drain of N4, which has its source coupled to REF. The output of the inverter 301 is coupled to the gate of N1 for receiving the VLSB signal and the VLS signal is provided to drive the gate of N4.

The sizes of the P-channel transistors P1 and P4 are large compared to the P-channel transistors P3 and P5, respectively. Due to this relative sizing, P1 and P3 act in combination with P4 and P5, respectively, as voltage dividers. P1 and P4 cannot pull all the way down to ground (zero) because a P-channel transistor with its drain tied to ground does not pull all the way down to zero. As the signals VLS and VLSB decrease down towards 0 volts, the body effect of P1 and P4, along with the current provided by P3 and P5, work together to the extent that P1 and P4 begin to turn off at the intermediate voltage level INT. In this manner, the VLS and VLSB signals do not drop below the INT voltage level as determined by the ratio of the sizes of P3 to P1 and P5 to P4. The voltage level of INT relative to the voltage levels of VDDL and REF is determined by the size ratio of P1 and P4 as compared to P1 and P3, respectively. For example, to increase INT, the size ratio of P3 to P1 and P5 to P4 is increased, and to decrease INT, the size ratio is decreased. The size ratio between P3 and P1 should be approximately the same as the size ratio between P5 and P4 to maintain the VLS and VLSB signals within approximately the same voltage range, although the relative size ratios may be different if desired.

In operation, when the LDS signal is pulled towards REF, the junction 303 is pulled to the voltage level of INT. P3 turns on and P1 is turned on weakly as determined by the current provided by P3. The LDSB signal is asserted towards VDDL turning off P2, P4 and P5. P6 is turned on and operates as a pull-up device to pull the VLSB signal to the voltage level of VDDL. In a similar manner, when the LDS signal is pulled towards the voltage of VDDL, the devices P1, P3 and P6 are turned off. The LDSB signal is pulled towards ground by the inverter 301 turning on P2 and P5 while P4 turns on weakly with current provided by P5. Thus, the VLSB signal is pulled to the voltage level of INT while the VLS signal is pulled to the voltage level of VDDL by P2. In this manner, the VLS and VLSB signals switch between INT and VDDL in response to switching of the LDS signal.

When the LDS signal is low, the VLS is pulled down to the INT voltage level, which turns P7 on. P7 pulls the SDS signal down when turned on, which also turns on P10. P10, when turned on, pulls the SDSB signal towards VDDH, which turns off P8. N3 is on when the SDSB signal is pulled high, so that the SDS signal is pulled down to the INT voltage level of VLS through N3. Meanwhile, the LDSB signal is high and the VLSB is pulled high to the voltage level of VDDL, turning off P9.

When LDS is high, the VLSB signal is pulled low to the INT voltage level, which turns P9 on. P9 pulls the SDSB signal down when turned on, which also turns on P8. P8, when turned on, pulls the SDS signal towards VDDH, which turns off P10. N6 is on when the SDS is pulled high, so that the SDSB signal is pulled down to the INT voltage level of the VLSB signal through N6. Meanwhile, the VLS signal is pulled high to the level of VDDL, turning off P7. In this manner, the SDS and SDSB signals switch between the INT and VDDH voltage levels in response to switching of the LDS and LDSB signals between the voltage levels of REF and VDDL. In the complementary configuration, the signals SDS and SDSB are switched to opposite logic states relative to each other. In one embodiment, INT is approximately 1.0 volt and VDDH is approximately 3.3 volts, so that the SDS and SDSB signals swing between 1 and 3.3 volts for a total voltage range of 2.3 volts.

The LDS signal turns N4 on when high and off when low. Likewise, the LDSB signal turns N1 on when high and off when low. The devices N2 and N5 are always on, and serve as protection devices for the transistors N1 and N4, respectively, by preventing either of the transistors N1 and N4 from receiving a high drain-to-source voltage VDS. In general during normal operation, N1 shares the load with N5 when N1 is turned on and N4 shares the load with N5 when N4 is turned on. The N1/N2 stack operates to shut off P7 hard when P8 is turned on (and when N1 is turned off). Otherwise, there could be current flow through P7 which might prevent the voltage of the SDS signal from reaching the voltage level of VDDH. Likewise, the N4/N5 stack operates to shut off P9 hard when P10 is turned on (and when N4 is turned off), so that the SDSB signal substantially reaches VDDH.

operates to help pull down the drain of the transistor P8 to the INT voltage level when P8 is turned off. Likewise, N6 operates to help pull down the drain of the transistor P10 to the INT voltage level when P10 is turned off. The SDS and SDSB signals do not go lower than the INT voltage level set by the VLS and VLSB signals, respectively, due to operation of the transistors N3 and N6, respectively. To prevent oxide breakdown, N3 and N6 are operated out of saturation in the linear region (i.e., VDS<(VGS−VTH)) during normal operation, so that when their gates switch high, their gate-to-channel voltage is always at a safe level. VTH is the gate to source threshold voltage level of N-channel transistors as known to those skilled in the art. The gates of N3 and N6 see roughly the INT voltage level (e.g., 1 volt) because their channels are fully formed. Otherwise, if N3 and N6 were allowed to saturate, their channels would be pinched off and their gates would see the bulk voltage, 0 volts, thus exceeding the oxide breakdown level.

Although the present invention has been described in considerable detail with reference to certain preferred versions thereof, other versions and variations are possible and contemplated. For example, a complementary configuration is illustrated in which it is contemplated that a singular output shifting device may be implemented. Furthermore, particular voltage levels and/or voltage ranges may be different depending upon the types of devices or fabrication processes. The associated voltage levels of 0.18 micron devices are illustrated in exemplary embodiments, where it is understood that the present invention applies to both smaller and larger devices associated with the same or different voltage levels. Positive or negative logic is contemplated and the actual voltage values may be positive or negative. The present invention concerns shifting the voltage magnitude associated with an arbitrary logic value to avoid excess voltage applied to a scaled driver device.

Moreover, the phenomena of gate oxide breakdown typically associated with MOS-type devices is not only a function of the device's fabrication process, but is also a function of the device's application, including the voltage requirements of external devices to which the fabricated device is required to interface. For example, although the illustrated embodiment of the level shifter circuit 103 includes two stages, additional intermediate digital switching stages may be included if the same fabrication process is employed to interface external devices operating at even higher voltage levels, such as 5 volts.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A digital level shifter for driving an input of a scaled driver device that has an output operative within an elevated voltage range, comprising:
    a digital voltage limiter coupled to first and second source voltages having first and second voltage levels, respectively, defining a first voltage range in which said second voltage level has a magnitude that is greater than said first voltage level, said digital voltage limiter receiving a digital input signal operative within said first voltage range and providing a corresponding voltage limited signal operative within a limited voltage range between said second voltage level and an intermediate voltage level that is between said first and second voltage levels; and
    a digital level-shifted switch coupled to a third source voltage and said first source voltage, wherein said third source voltage has a third voltage level with a magnitude that is greater than said magnitude of said second voltage level, said digital level-shifted switch receiving said voltage limited signal and correspondingly switching a voltage shifted digital signal within a voltage shifted range defined between said intermediate and third voltage levels in response to switching of said voltage limited signal;
    wherein said intermediate voltage level is greater than said first voltage level to preclude gate oxide breakdown of the scaled driver device.

2. The digital level shifter of claim 1, wherein said digital voltage limiter comprises a digital voltage divider having an input that receives said digital input signal and a junction that develops said voltage limited signal.

3. The digital level shifter of claim 2, wherein said digital level-shifted switch comprises:
    a P-channel circuit, coupled between said third source voltage and at least one bias node, said P-channel circuit coupled to said junction for receiving said voltage limited signal and switching said voltage shifted digital signal in response to switching of said voltage limited signal; and
    an N-channel circuit coupled to said first and second source voltages and coupled in a series configuration with said P-channel circuit at said least one bias node, said N-channel circuit receiving said digital input signal and operative to facilitate switching of said voltage shifted digital signal by said P-channel circuit.

4. The digital level shifter of claim 1, wherein said digital voltage limiter comprises:
    a first P-channel device having a gate receiving said digital input signal and a source and a drain coupled between said second source voltage and a junction; and
    a second P-channel device having a source coupled to said junction, a drain coupled to said first source voltage and a gate that receives said digital input signal;
    wherein said second P-channel device is sized larger relative to said first P-channel device to keep a magnitude of said voltage limited signal from dropping below said magnitude of said intermediate voltage level.

5. The digital level shifter of claim 4, wherein said second P-channel device is sized larger than said first P-channel device so that said second P-channel device begins to turn off as said digital input signal switches towards said first voltage level.

6. The digital level shifter of claim 4, wherein said digital voltage limiter further comprises:
    a third P-channel device having a gate and having a source and a drain coupled between said second source voltage and said junction; and
    an inverter having an input receiving said digital input signal and an output coupled to said gate of said third P-channel device;
    wherein said third P-channel device pulls said junction to said second voltage level when turned on.

7. The digital level shifter of claim 1, wherein said digital level-shifted switch comprises:
    first, second and third P-channel devices, each having an N well coupled to said third source voltage, and each having a source, a drain and a gate;
    said first P-channel device having its source coupled to said third source voltage and its drain coupled to an output node which is further coupled to said source of said second P-channel device and to said gate of said third P-channel device, wherein said output node develops said voltage shifted digital signal;
    said second P-channel device having its drain coupled to said first source voltage and its gate coupled to said junction providing said voltage limited signal;
    said third P-channel device having its source coupled to said third source voltage and its drain coupled to said gate of said first P-channel device; and
    a first N-channel device having its source coupled to said junction, its drain coupled to said drain of said first P-channel device, and its gate coupled to said gate of said first P-channel device.

8. The digital level shifter of claim 7, wherein said digital level-shifted switch further comprises:
    a second N-channel device having a source, a drain coupled to said drain of said second P-channel device and a gate coupled to said second source voltage; and
    a third N-channel device having a source coupled to said first source voltage, a drain coupled to said source of said second N-channel device and a gate receiving an inverted digital input signal; and
    an inverter having an input receiving said digital input signal and an output that provides said inverted input signal.

9. A digital level shifter, comprising:
    a digital voltage divider comprising a plurality of P-channel devices coupled between a reference voltage and a first source voltage, said digital voltage divider receiving a digital input signal operative within a first voltage range between said reference and first source voltages and having a junction that develops a voltage limited signal operative within a limited voltage range between said first source voltage and an intermediate voltage having a voltage level between said reference voltage and said first source voltage; and
    a digital level-shifted switch comprising a plurality of P-channel and N-channel devices coupled in a series configuration between said reference voltage and a second source voltage having a voltage level that is greater than said first source voltage, said digital level-shifted switch having an input that receives said voltage limited signal and an output that provides a shifted digital signal operative within a voltage shifted range between said intermediate and second source voltages.

10. The digital level shifter of claim 9, wherein said digital voltage divider comprises:
  a first P-channel transistor having a gate receiving said digital input signal, a source coupled to said first source voltage and a drain coupled to a first junction;
  a second P-channel transistor having a source coupled to said first junction, a drain coupled to said reference voltage and a gate that receives said digital input signal;
  an inverter having an input receiving said digital input signal and an output that provides an inverted input signal, wherein said digital input signal and said inverted input signal both operate in said first voltage range;
  a third P-channel transistor having a gate receiving said inverted input signal, a source coupled to receive said first source voltage and a drain coupled to a second junction;
  a fourth P-channel transistor having a source coupled to said second junction, a drain coupled to receive said second source voltage and a gate that receives said digital input signal;
  wherein said second and fourth P-channel transistors are sized larger relative to said first and third P-channel transistors, respectively, so that a pair of complementary voltage limited signals are developed at said first and second junctions, respectively, which are both operative within limited voltage range;
  a fifth P-channel transistor having a source coupled to receive said first source voltage, a drain coupled to said first junction and a gate that receives said inverted input signal; and
  a sixth P-channel transistor having a source coupled to receive said first source voltage, a drain coupled to said second junction and a gate that receives said digital input signal.

11. The digital level shifter of claim 10, wherein said digital level-shifted switch comprises:
  a seventh P-channel transistor having a gate coupled to said first junction and a source and a drain;
  an eighth P-channel transistor having a drain coupled to said second source voltage, a drain coupled to said source of said eighth P-channel transistor and a gate;
  a ninth P-channel transistor having a source coupled to said third source voltage, a drain coupled to said gate of said eighth P-channel transistor, and a gate coupled to said drain of said eighth P-channel transistor;
  a tenth P-channel transistor having a gate coupled to said second junction, a source coupled to said drain of said ninth P-channel transistor and a drain;
  a first N-channel transistor having a source coupled to said reference voltage, a gate coupled to receive said inverted input signal and a drain;
  a second N-channel transistor having a source coupled to said drain of said first N-channel transistor, a gate coupled to said first source voltage, and a drain coupled to said drain of said seventh P-channel transistor;
  a third N-channel transistor having a source coupled to said first junction, a gate coupled to said gate of said eighth P-channel transistor and a drain coupled to said drain of said eighth P-channel transistor;
  a fourth N-channel transistor having a source coupled to said reference voltage, a gate coupled to receive said digital input signal and a drain;
  a fifth N-channel transistor having a source coupled to said drain of said fourth N-channel transistor, a gate coupled to said first source voltage, and a drain coupled to said drain of said tenth P-channel transistor; and
  a sixth N-channel transistor having a source coupled to said second junction, a gate coupled to said gate of said ninth P-channel transistor and a drain coupled to said drain of said ninth P-channel transistor;
  wherein a pair of complementary digital output signals are developed at said gates of said eighth and ninth P-channel transistors that each operate within said voltage shifted range.

12. The digital level shifter of claim 11, wherein said first, second, third, fourth, fifth and sixth P-channel transistors each have an N well coupled to said first source voltage and wherein said seventh, eighth, ninth and tenth P-channel transistors each have an N well coupled to said second voltage source signal.

13. The digital level shifter of claim 12, wherein each of said N-channel and P-channel transistors and said inverter comprise 0.18 micron devices having a gate oxide thickness of approximately 40 angstroms.

14. The digital level shifter of claim 13, wherein said first source voltage is approximately 1.8 volts, wherein said reference voltage is approximately 0 volts, wherein said second source voltage is approximately 3.3 volts, and wherein said intermediate voltage is approximately 1 volt.

15. The digital level shifter of claim 11, wherein said second and fifth N-channel transistors remain on during normal operation to share load with said first and fourth N-channel transistors, respectively.

16. The digital level shifter of claim 11, wherein said third and sixth N-channel transistors are operated out of saturation in respective linear regions during normal operation.

17. An integrated circuit (IC), comprising:
  core circuitry, coupled to a reference voltage and a first source voltage, for generating a first digital signal operative within a first voltage range defined by said reference and first source voltages;
  a digital level shifter, coupled to said reference and first source voltages, and to a second source voltage, said second source voltage being greater than said first source voltage, for receiving said first digital signal, and for providing a shifted digital signal indicative of a state of said first digital signal, wherein said shifted digital signal is operated between said second source voltage and an intermediate voltage, said intermediate voltage being between said reference and first source voltages, said digital level shifter comprising:
    a digital voltage limiter, coupled to said reference and first source voltages, that switches a voltage limited digital signal between said intermediate voltage and said reference source voltage in response to switching of said first digital signal; and
    a digital level-shifted switch, coupled to said digital voltage limiter and to said reference and second source voltages, that switches said shifted digital signal between said intermediate voltage and said second source voltage in response to switching of said voltage limited digital signal; and
  a scaled driver device, for receiving said shifted digital signal, and for providing a second digital signal indicative of a state of said first digital signal, wherein said second digital signal is operated within an elevated voltage range defined by said reference and second source voltages, wherein operation of said shifted digital signal at said intermediate voltage precludes oxide breakdown of said scaled driver device.

18. The IC of claim 17, wherein said digital voltage limiter comprises:
  a plurality of P-channel transistors having scaled sizes and coupled to form a digital voltage divider that receives said first digital signal and that has a junction for providing said voltage limited digital signal; and
  and wherein said digital level-shifted switch comprises a plurality of P-channel and N-channel transistors coupled in a series configuration having an input that receives said voltage limited digital signal and an output that provides said shifted digital signal.

19. The IC of claim 17, wherein said core circuitry, said digital level shifter, and said scaled driver device are fabricated using 0.18 micron devices each having a gate oxide thickness of approximately 40 angstroms.

20. The IC of claim 19, wherein said first source voltage is approximately 1.8 volts, wherein said reference voltage is approximately 0 volts, wherein said second source voltage is approximately 3.3 volts, and wherein said intermediate voltage is approximately 1 volt.

* * * * *